(12) United States Patent
Narushima et al.

(10) Patent No.: US 10,910,225 B2
(45) Date of Patent: Feb. 2, 2021

(54) FILM FORMING METHOD

(71) Applicant: TOKYO ELECTRON LIMITED, Tokyo (JP)

(72) Inventors: Kensaku Narushima, Nirasaki (JP); Atsushi Matsumoto, Nirasaki (JP); Nagayasu Hiramatsu, Hillsboro, OR (US); Takanobu Hotta, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 159 days.

(21) Appl. No.: 16/201,129

(22) Filed: Nov. 27, 2018

(65) Prior Publication Data
US 2019/0164768 A1 May 30, 2019

(30) Foreign Application Priority Data
Nov. 28, 2017 (JP) .................. 2017-228351

(51) Int. Cl.
| | |
|---|---|
| *H01L 21/285* | (2006.01) |
| *C23C 16/34* | (2006.01) |
| *C23C 16/44* | (2006.01) |
| *C23C 16/455* | (2006.01) |
| *H01L 21/768* | (2006.01) |
| *H01L 21/28* | (2006.01) |

(52) U.S. Cl.
CPC ........ *H01L 21/28556* (2013.01); *C23C 16/34* (2013.01); *C23C 16/4412* (2013.01); *C23C 16/45534* (2013.01); *C23C 16/45553* (2013.01); *C23C 16/45561* (2013.01); *H01L 21/28088* (2013.01); *H01L 21/76843* (2013.01)

(58) Field of Classification Search
CPC .................................................... H01L 21/285
See application file for complete search history.

(56) References Cited

U.S. PATENT DOCUMENTS

2016/0233099 A1* 8/2016 Narushima ....... H01L 21/28556

FOREIGN PATENT DOCUMENTS

| | | |
|---|---|---|
| JP | 2013-122069 A | 6/2013 |
| KR | 10-2006-0042662 A | 5/2006 |
| KR | 10-2006-0070064 A | 6/2006 |
| KR | 10-2014-0141686 A | 12/2014 |

* cited by examiner

*Primary Examiner* — Marvin Payen
(74) *Attorney, Agent, or Firm* — Nath, Goldberg & Meyer; Jerald L. Meyer

(57) ABSTRACT

There is provided a method of forming a tungsten nitride film on a substrate to be processed, including: forming a tungsten film by repeating a cycle of alternately supplying a tungsten chloride gas and a hydrogen-containing gas with a supply of a purge gas interposed between the supply of the tungsten chloride gas and the supply of the hydrogen-containing gas; and nitriding the tungsten film by supplying a nitrogen-containing gas.

6 Claims, 7 Drawing Sheets

FIG. 7

| Sample | F | G | H | I | J | K |
|---|---|---|---|---|---|---|
| Process | $(WCl_6+H_2) \times 46$ | $[(WCl_6+H_2) \times 46+NH_3] \times 1$ | $[(WCl_6+H_2) \times 30+NH_3] \times 2$ | $[(WCl_6+H_2) \times 25+NH_3] \times 3$ | $[(WCl_6+H_2) \times 15+NH_3] \times 5$ | $(WCl_6+NH_3) \times 70$ |
| Recipe time (sec) | 126 | 226 | 310 | 405 | 595 | 6450 |
| Temperature (°C) | 500 | 500 | 500 | 500 | 500 | 500 |
| Thickness (nm) | 2.97 | 3.07 | 2.69 | 2.96 | 2.71 | 2.25 |
| Crystal | W | W | $W_2N$ | $W_2N$ | $W_2N$ | $W_2N$ |
| Particle (>0.06 μm) | 4 | 16 | 2 | 2437 | 23939 | overload |

//  # FILM FORMING METHOD

CROSS-REFERENCE TO RELATED APPLICATION

This application is based upon and claims the benefit of priority from Japanese Patent Application No. 2017-228351, filed on Nov. 28, 2017, the entire contents of which are incorporated herein by reference.

TECHNICAL FIELD

The present disclosure relates to a film forming method.

BACKGROUND

In a manufacturing process of a semiconductor device, a tungsten nitride film is used as a gate metal of a transistor or a contact metal for bonding metals.

A tungsten nitride film is formed by, for example, an Atomic Layer Deposition (ALD) method using a tungsten hexafluoride ($WF_6$) gas. In the ALD method, a tungsten nitride film having good step coverage can be formed as compared with a Physical Vapor Deposition (PVD) method or a Chemical Vapor Deposition (CVD) method.

However, in the ALD method using a $WF_6$ gas, fluorine originating from the $WF_6$ gas may be introduced into the tungsten nitride film to be formed. When fluorine is introduced into the tungsten nitride film, fluorine may diffuse to another layer in a later process, which may degrade device characteristics.

SUMMARY

Some embodiments of the present disclosure provide a film forming method capable of forming a tungsten nitride film having a low fluorine concentration and a good filling property.

According to one embodiment of the present disclosure, there is provided a method of forming a tungsten nitride film on a substrate to be processed, including: forming a tungsten film by repeating a cycle of alternately supplying a tungsten chloride gas and a hydrogen-containing gas with a supply of a purge gas interposed between the supply of the tungsten chloride gas and the supply of the hydrogen-containing gas; and nitriding the tungsten film by supplying a nitrogen-containing gas.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 7 is a diagram showing the film characteristics obtained in an Example.

DETAILED DESCRIPTION

Figure 1:
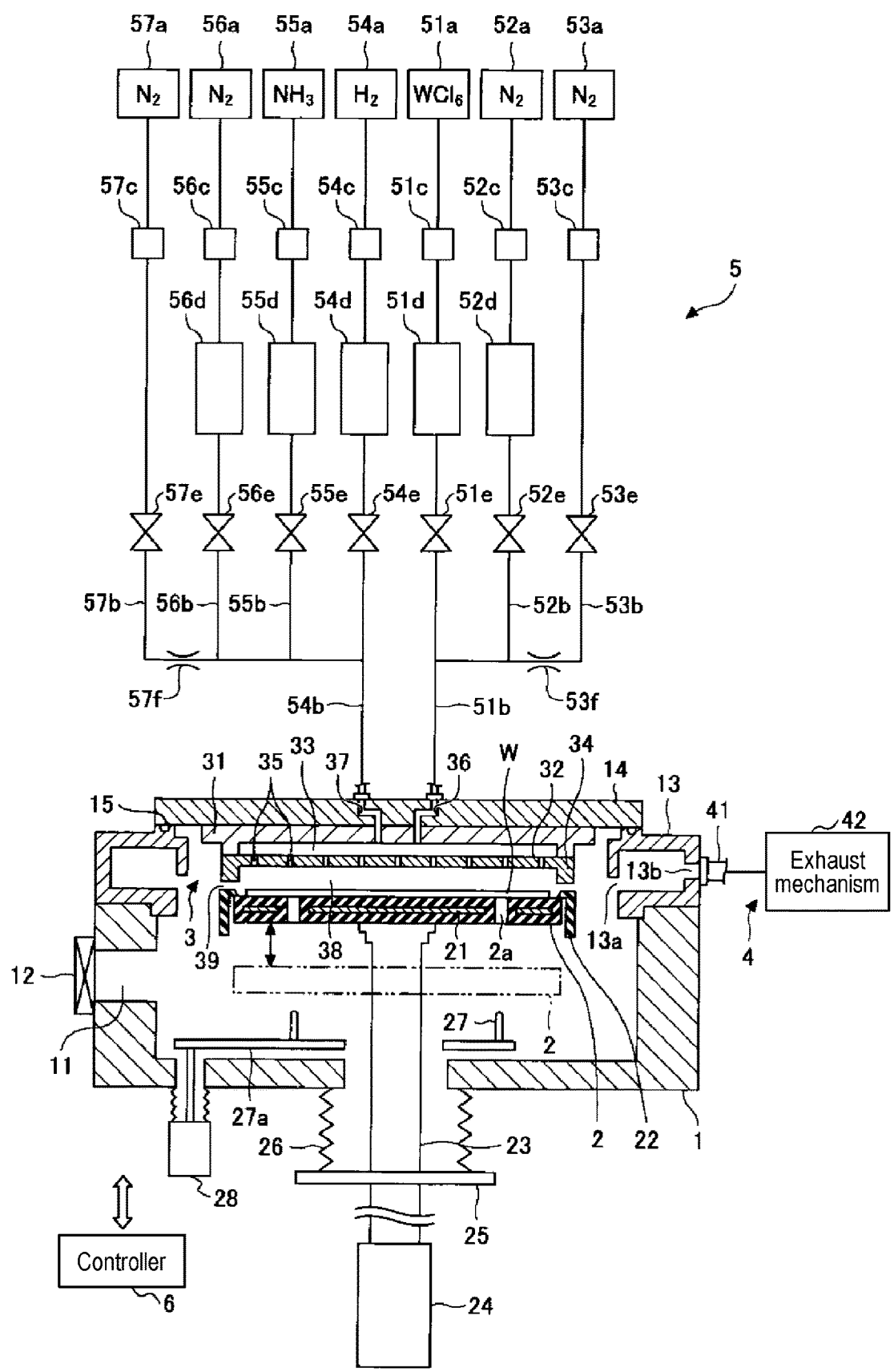
FIG. 1 is a schematic sectional view of a film forming apparatus according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. In the specification and the drawings, substantially the same components will be denoted by like reference numerals, and redundant description thereof will be omitted.

[Film Forming Apparatus]

An example of a film forming apparatus used for carrying out a method for forming a tungsten nitride film according to an embodiment of the present disclosure will be described. FIG. 1 is a schematic sectional view of a film forming apparatus according to the embodiment of the present disclosure.

The film forming apparatus includes a processing container 1, a mounting table 2, a shower head 3, an exhaust part 4, a gas supply mechanism 5, and a controller 6.

The processing container 1 is made of a metal such as aluminum or the like and has a substantially cylindrical shape. A loading/unloading port 11 for loading or unloading a semiconductor wafer (hereinafter referred to as "wafer W") as a substrate to be processed is formed on a side wall of the processing container 1. The loading/unloading port 11 is opened and closed by a gate valve 12. An annular exhaust duct 13 having a rectangular cross section is provided on a main body of the processing container 1. A slit 13a is formed in the exhaust duct 13 along an inner circumferential surface thereof. An exhaust port 13b is formed in an outer wall of the exhaust duct 13. On an upper surface of the exhaust duct 13, a top wall 14 is provided so as to close an upper opening of the processing container 1. A gap between the exhaust duct 13 and the top wall 14 is hermetically sealed by a seal ring 15.

The mounting table 2 horizontally supports the wafer W in the processing container 1. The mounting table 2 is formed in a disk shape so as to correspond in size to the wafer W and is supported by a support member 23. The mounting table 2 is formed of a ceramic material such as aluminum nitride (AlN) or the like, or a metallic material such as aluminum or nickel alloy. A heater 21 for heating the wafer W is buried in the mounting table 2. The heater 21 is supplied with electric power from a heater power supply (not shown) to generate heat. Then, the output of the heater 21 is controlled by a temperature signal of a thermocouple (not shown) provided in the vicinity of an upper surface of the mounting table 2, whereby the wafer W is controlled to a predetermined temperature. The mounting table 2 is provided with a cover member 22 formed of ceramics such as alumina or the like so as to cover the outer peripheral region of the upper surface and the side surface.

On a bottom surface of the mounting table 2, there is provided a support member 23 for supporting the mounting table 2. The support member 23 extends downward from the center of the bottom surface of the mounting table 2 through a hole portion formed in a bottom wall of the processing container 1. A lower end of the support member 23 is connected to an elevating mechanism 24. The mounting table 2 is raised and lowered via the support member 23 by the elevating mechanism 24 between a processing position shown in FIG. 1 and a transfer position located below the processing position and indicated by a two-dot chain line, in which the wafer W can be transferred. A flange portion 25 is attached to the support member 23 on a lower side of the processing container 1. Between the bottom surface of the processing container 1 and the flange portion 25, there is provided a bellows 26 which partitions an atmosphere inside the processing container 1 from an external air and which expands and contracts along with the elevation movement of the mounting table 2.

Three wafer support pins 27 (only two of which are shown) are provided in the vicinity of the bottom surface of the processing container 1 so as to protrude upward from a lift plate 27a. The wafer support pins 27 are moved up and down via the lift plate 27a by a lift mechanism 28 provided below the processing container 1. The wafer support pins 27 can be inserted through the through holes 2a formed in the mounting table 2 located at the transfer position and can protrude and retract with respect to the upper surface of the mounting table 2. By moving the wafer support pins 27 up and down, the transfer of the wafer W between the transfer mechanism (not shown) and the mounting table 2 is performed.

The shower head 3 supplies a processing gas into the processing container 1 in a shower shape. The shower head 3 is made of metal and is provided so as to face the mounting table 2. The shower head 3 has substantially the same diameter as the mounting table 2. The shower head 3 includes a main body portion 31 fixed to the top wall 14 of the processing container 1 and a shower plate 32 connected to a lower surface of the main body portion 31. A gas diffusion space 33 is formed between the main body portion 31 and the shower plate 32. Gas introduction holes 36 and 37 are formed in the gas diffusion space 33 so as to penetrate the top wall 14 of the processing container 1 and the center of the main body portion 31. An annular protrusion 34 protruding downward is formed in the peripheral edge portion of the shower plate 32. Gas discharge holes 35 are formed in a flat surface on the inner side of the annular protrusion 34. In a state in which the mounting table 2 is present in the processing position, a processing space 38 is formed between the mounting table 2 and the shower plate 32, and an annular gap 39 is formed between the cover member 22 and the annular protrusion 34 as the top surface of the cover member 22 and the annular protrusion 34 come close to each other.

The exhaust part 4 evacuates the inside of the processing container 1. The exhaust part 4 includes an exhaust pipe 41 connected to the exhaust port 13b and an exhaust mechanism 42 including a vacuum pump, a pressure control valve and the like connected to the exhaust pipe 41. In a process, the gas in the processing container 1 is moved to the exhaust duct 13 via the slit 13a and is exhausted from the exhaust duct 13 through the exhaust pipe 41 by the exhaust mechanism 42.

The gas supply mechanism 5 supplies a processing gas into the processing container 1. The gas supply mechanism 5 includes a $WCl_6$ gas supply source 51a, an $N_2$ gas supply source 52a, an $N_2$ gas supply source 53a, an $H_2$ gas supply source 54a, an $NH_3$ gas supply source 55a, an $N_2$ gas supply source 56a, and an $N_2$ gas supply source 57a.

The $WCl_6$ gas supply source 51a supplies a $WCl_6$ gas, which is a tungsten chloride gas, into the processing container 1 via a gas supply line 51b. In the gas supply line 51b, a flow rate controller 51c, a storage tank 51d and a valve 51e are provided sequentially from the upstream side. On the downstream side of the valve 51e, the gas supply line 51b is connected to the gas introduction hole 36. The $WCl_6$ gas supplied from the $WCl_6$ gas supply source 51a is temporarily stored in the storage tank 51d before being supplied into the processing container 1. The $WCl_6$ gas is pressurized to a predetermined pressure in the storage tank 51d and then supplied into the processing container 1. The supply and stoppage of the $WCl_6$ gas from the storage tank 51d to the processing container 1 are performed by the valve 51e. By temporarily storing the $WCl_6$ gas in the storage tank 51d in this manner, the $WCl_6$ gas can be stably supplied into the processing container 1 at a relatively large flow rate. A bypass pipe connected to the exhaust pipe 41 may be attached to the gas supply line 51b between the storage tank 51d and the valve 51e. In this case, a valve for controlling the supply and stoppage of the $WCl_6$ gas from the gas supply line 51b to the exhaust pipe 41 is installed in the bypass pipe.

The $N_2$ gas supply source 52a supplies an $N_2$ gas, which is a purge gas, into the processing container 1 via a gas supply line 52b. In the gas supply line 52b, a flow rate controller 52c, a storage tank 52d and a valve 52e are provided sequentially from the upstream side. On the downstream side of the valve 52e, the gas supply line 52b is connected to the gas supply line 51b. The $N_2$ gas supplied from the $N_2$ gas supply source 52a is temporarily stored in the storage tank 52d before being supplied into the processing container 1. The $N_2$ gas is pressurized to a predetermined pressure in the storage tank 52d and then supplied into the processing container 1. The supply and stoppage of the $N_2$ gas from the storage tank 52d to the processing container 1 are performed by the valve 52e. By temporarily storing the $N_2$ gas in the storage tank 52d in this way, the $N_2$ gas can be stably supplied into the processing container 1 at a relatively large flow rate.

The $N_2$ gas supply source 53a supplies an $N_2$ gas, which is a carrier gas, into the processing container 1 via a gas supply line 53b. In the gas supply line 53b, a flow rate controller 53c, a valve 53e and an orifice 53f are provided sequentially from the upstream side. On the downstream side of the orifice 53f, the gas supply line 53b is connected to the gas supply line 51b. The $N_2$ gas supplied from the $N_2$ gas supply source 53a is continuously supplied into the processing container 1 during the film formation on the wafer W. The supply and stoppage of the $N_2$ gas from the $N_2$ gas supply source 53a to the processing container 1 are performed by the valve 53e. Although gases are supplied to the gas supply lines 51b and 52b at a relatively large flow rate by the storage tanks 51d and 52d, the gases supplied to the gas supply lines 51b and 52b are prevented by the orifice 53f from flowing back to the $N_2$ gas supply line 53b.

The $H_2$ gas supply source 54a supplies an $H_2$ gas, which is a hydrogen-containing gas, into the processing container 1 via a gas supply line 54b. In the gas supply line 54b, a flow rate controller 54c, a storage tank 54d and a valve Me are provided sequentially from the upstream side. On the downstream side of the valve Me, the gas supply line 54b is connected to the gas introduction hole 37. The $H_2$ gas supplied from the $H_2$ gas supply source Ma is temporarily stored in the storage tank 54d before being supplied into the processing container 1. The $H_2$ gas is pressurized to a predetermined pressure in the storage tank 54d and then supplied into the processing container 1. The supply and stoppage of the $H_2$ gas from the storage tank 54d to the processing container 1 is performed by the valve Me. By temporarily storing the $H_2$ gas in the storage tank 54d in this way, the $H_2$ gas can be stably supplied into the processing container 1 at a relatively large flow rate. A bypass pipe connected to the exhaust pipe 41 may be attached to the gas supply line 54b between the storage tank 54d and the valve Me. In this case, a valve for controlling the supply and stoppage of the $H_2$ gas from the gas supply line 54b to the exhaust pipe 41 is installed in the bypass pipe.

The $NH_3$ gas supply source 55a supplies an $NH_3$ gas, which is a nitrogen-containing gas, into the processing container 1 via a gas supply line 55b. In the gas supply line 55b, a flow rate controller 55c, a storage tank 55d and a valve 55e are provided sequentially from the upstream side. On the downstream side of the valve 55e, the gas supply line 55b is connected to the gas supply line 54b. The $NH_3$ gas supplied from the $NH_3$ gas supply source 55a is temporarily stored in the storage tank 55d before being supplied into the processing container 1. The $NH_3$ gas is pressurized to a predetermined pressure in the storage tank 55d and then supplied into the processing container 1. The supply and stoppage of the $NH_3$ gas from the storage tank 55d to the processing container 1 are performed by the valve 55e. By temporarily storing the $NH_3$ gas in the storage tank 55d in this manner, the $NH_3$ gas can be stably supplied into the processing container 1 at a relatively large flow rate. A bypass pipe connected to the exhaust pipe 41 may be attached to the gas supply line 55b between the storage tank 55d and the valve 55e. In this case, a valve for controlling the supply and stoppage of the $NH_3$ gas from the gas supply line 55b to the exhaust pipe 41 is installed in the bypass pipe.

The $N_2$ gas supply source 56a supplies an $N_2$ gas, which is a purge gas, into the processing container 1 via a gas supply line 56b. In the gas supply line 56b, a flow rate controller 56c, a storage tank 56d and a valve 56e are provided sequentially from the upstream side. On the downstream side of the valve 56e, the gas supply line 56b is connected to the gas supply line 54b. The $N_2$ gas supplied from the $N_2$ gas supply source 56a is temporarily stored in the storage tank 56d before being supplied into the processing container 1. The $N_2$ gas is pressurized to a predetermined pressure in the storage tank 56d and then supplied into the processing container 1. The supply and stoppage of the $N_2$ gas from the storage tank 56d to the processing container 1 is performed by the valve 56e. By temporarily storing the $N_2$ gas in the storage tank 56d in this manner, the $N_2$ gas can be stably supplied into the processing container 1 at a relatively large flow rate.

The $N_2$ gas supply source 57a supplies an $N_2$ gas, which is a carrier gas, into the processing container 1 via a gas supply line 57b. In the gas supply line 57b, a flow rate controller 57c, a valve 57e and an orifice 57f are provided sequentially from the upstream side. On the downstream side of the orifice 57f, the gas supply line 57b is connected to the gas supply line 54b. The $N_2$ gas supplied from the $N_2$ gas supply source 57a is continuously supplied into the processing container 1 during the film formation on the wafer W. The supply and stoppage of the $N_2$ gas from the $N_2$ gas supply source 57a to the processing container 1 are performed by the valve 57e. Although gases are supplied to the gas supply lines 54b to 56b by the storage tanks 54d to 56d at a relatively large flow rate, the gases supplied to the gas supply lines 54b to 56b are prevented by the orifice 57f from flowing back to the $N_2$ gas supply line 57b.

The controller 6 is, for example, a computer, and includes a CPU (Central Processing Unit), a RAM (Random Access Memory), a ROM (Read Only Memory), an auxiliary storage device, and the like. The CPU operates based on a program stored in the ROM or the auxiliary storage device and controls the operation of the film forming apparatus. The controller 6 may be provided inside the film forming apparatus or may be provided outside the film forming apparatus. When the controller 6 is provided outside the film forming apparatus, the controller 6 may control the film forming apparatus through a communication means such as a wire communication means or a wireless communication means.

[Film Forming Method]

Figure 2:
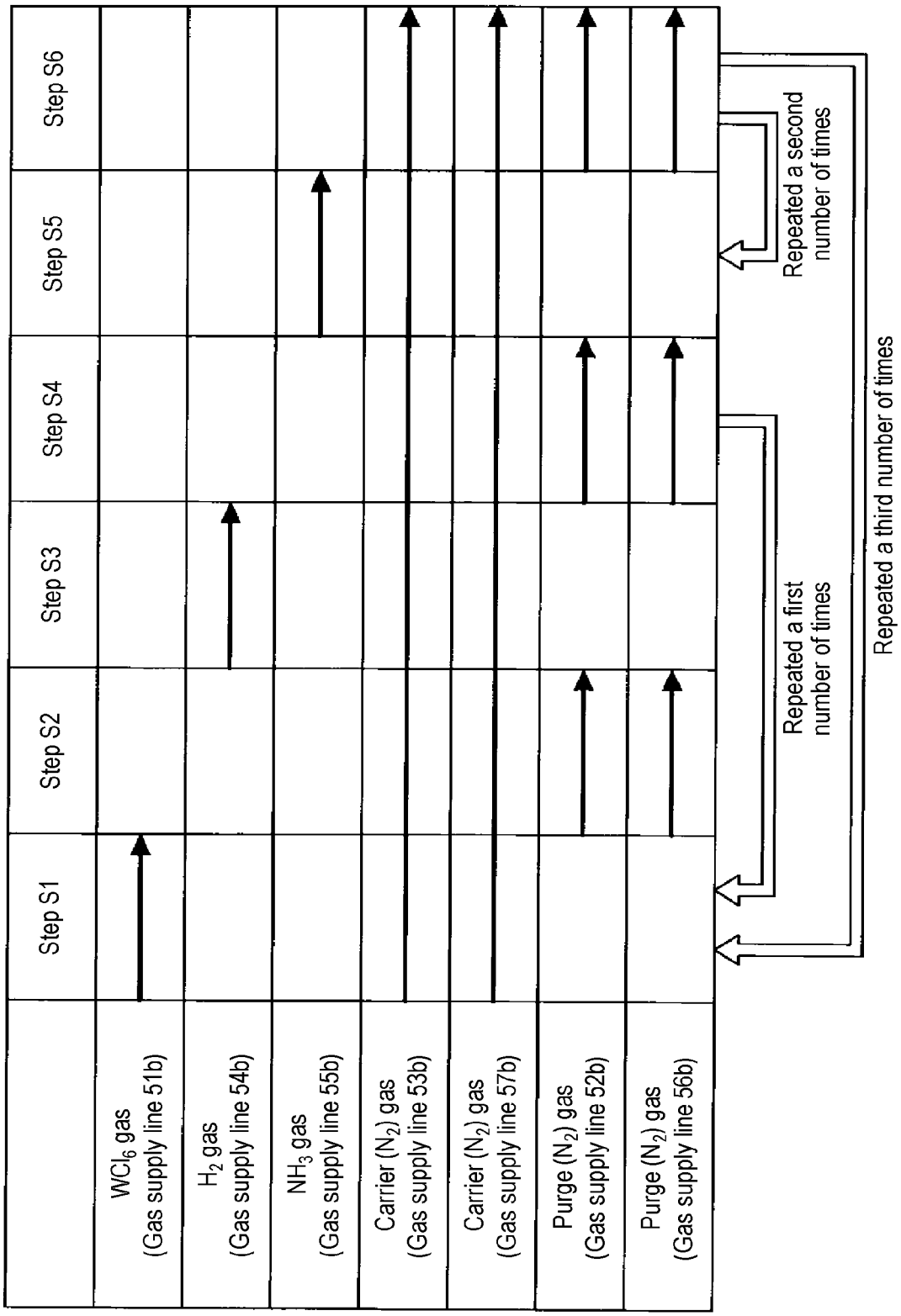
FIG. 2 is a diagram showing a gas supply sequence of a method for forming a tungsten nitride film according to an embodiment of the present disclosure.

A method of forming a tungsten nitride film using the above-described film forming apparatus will be described with reference to FIGS. 1 and 2. Since the film forming method according to the embodiment of the present disclosure can form a tungsten nitride film having a low fluorine concentration and a good filling property, the film forming method is suitable for forming a tungsten nitride film on a wafer W on which a plurality of recesses having high aspect ratios or a plurality of recesses having different sizes are formed. However, the film forming method according to the embodiment of the present disclosure can also be applied to a case where a tungsten nitride film is formed on a wafer W on which no recess is formed.

First, the valves 57e and 53e or the valves 56e and 52e are opened so that the $N_2$ gas flows at a predetermined flow rate (for example, 100 to 1000 sccm). In this state, the gate valve 12 is opened, and the wafer W is transferred into the processing container 1 by the transfer mechanism and mounted on the mounting table 2 located at the transfer position. After the transfer mechanism is retracted from the inside of the processing container 1, the gate valve 12 is closed. The wafer W is heated to a predetermined temperature (for example, 250 to 550 degrees C.) by the heater 21 of the mounting table 2, and the mounting table 2 is raised to the processing position to form the processing space 38. The valves 52e and 56e are opened to supply the $N_2$ gas, and the internal pressure of the processing container 1 is adjusted to a predetermined pressure by the pressure control valve of the exhaust mechanism 42.

Further, the $WCl_6$ gas is supplied from the $WCl_6$ gas supply source 51a to the gas supply line 51b. At this time, the valve 51e is closed. Therefore, the $WCl_6$ gas is stored in the storage tank 51d, and the pressure in the storage tank 51d is increased.

Next, the valves 52e and 56e are closed and the valve 51e is opened to stop the supply of the purge gas ($N_2$ gas) into the processing container 1 and to supply the $WCl_6$ gas stored in the storage tank 51d into the processing container 1 so that the $WCl_6$ gas is adsorbed to the surface of the wafer W (step S1). In parallel with the supply of the $WCl_6$ gas into the processing container 1, the purge gas is supplied from the $N_2$ gas supply sources 52a and 56a to the gas supply lines 52b and 56b, respectively. At this time, by closing the valves 52e and 56e, the purge gas is stored in the storage tanks 52d and 56d, and the internal pressure of the storage tanks 52d and 56d is increased.

After a predetermined time (for example, 0.01 to 1 second) has elapsed since opening the valve 51e, the valve 51e is closed and the valves 52e and 56e are opened to stop the supply of the $WCl_6$ gas into the processing container 1 and to supply the purge gas stored in the storage tanks 52d and 56d into the processing container 1 (step S2). At this time, the purge gas is supplied from the storage tanks 52d and 56d having an increased pressure. Therefore, the purge gas is supplied into the processing container 1 at a relatively large flow rate, for example, a flow rate larger than the flow rate of the carrier gas. Thus, the $WCl_6$ gas remaining in the processing container 1 is promptly discharged to the exhaust pipe 41, and the internal atmosphere of the processing container 1 is changed from the $WCl_6$ gas atmosphere to the $N_2$ gas atmosphere in a short time. On the other hand, as the valve 51e is closed, the $WCl_6$ gas supplied from the $WCl_6$ gas supply source 51a to the gas supply line 51b is stored in the storage tank 51d, and the internal pressure of the storage tank 51d is increased. Further, the $H_2$ gas is supplied to the gas supply line 54b. At this time, the valve 54e is closed. Therefore, the $H_2$ gas is stored in the storage tank 54d, and the internal pressure of the storage tank 54d is increased.

After a predetermined time (for example, 0.01 to 1 second) has elapsed since opening the valves 52e and 56e, the valves 52e and 56e are closed and the valve 54e is opened to stop the supply of the purge gas into the processing container 1 and to supply the $H_2$ gas stored in the storage tank 54d into the processing container 1, thereby reducing the $WCl_6$ gas adsorbed to the surface of the wafer W (step S3). At this time, the valves 52e and 56e are closed. Therefore, the purge gas supplied from the $N_2$ gas supply sources 52a and 56a to the gas supply lines 52b and 56b, respectively, is stored in the storage tanks 52d and 56d, and the internal pressure of the storage tanks 52d and 56d is increased.

After a predetermined time (for example, 0.01 to 1 second) has elapsed since opening the valve 54e, the valve 54e is closed and the valves 52e and 56e are opened to stop the supply of the $H_2$ gas into the processing container 1 and to supply the purge gas stored in the storage tanks 52d and 56d into the processing container 1 (step S4). At this time, the purge gas is supplied from the storage tanks 52d and 56d having an increased pressure. Therefore, the purge gas is supplied into the processing container 1 at a relatively large flow rate, for example, a flow rate larger than the flow rate of the carrier gas. Thus, the $H_2$ gas remaining in the processing container 1 is promptly discharged to the exhaust pipe 41, and the internal atmosphere of the processing container 1 is changed from the $H_2$ gas atmosphere to the $N_2$ gas atmosphere in a short time. On the other hand, as the valve Me is closed, the $H_2$ gas supplied from the $H_2$ gas supply source Ma to the gas supply line 54b is stored in the storage tank 54d, and the internal pressure of the storage tank 54d is increased.

A cycle of the above steps S1 to S4 (hereinafter referred to as "cycle α") is performed once to form a thin tungsten unit film. Then, the cycle α is repeated by the first number of times (for example, 1 to 100 times) to form a tungsten film having a predetermined film thickness.

After repeating the cycle α by a predetermined number of times, the valves 52e and 56e are closed. Further, the $NH_3$ gas is supplied to the gas supply line 55b. At this time, the valve 55e is closed. Therefore, the $NH_3$ gas is stored in the storage tank 55d, and the internal pressure of the storage tank 55d is increased.

Next, the valve 55e is opened, the $NH_3$ gas stored in the storage tank 55d is supplied into the processing container 1, and the tungsten film formed on the surface of the wafer W is nitrided (step S5). In parallel with the supply of the $NH_3$ gas into the processing container 1, the purge gas ($N_2$ gas) is supplied to the gas supply lines 52b and 56b from the $N_2$ gas supply sources 52a and 56a, respectively. At this time, by closing the valves 52e and 56e, the purge gas is stored in the storage tanks 52d and 56d, and the internal pressure of the storage tanks 52d and 56d is increased. Further, in step S5, high frequency power may be applied to the mounting table 2 or the shower head 3, whereby the $NH_3$ gas supplied into the processing container 1 is converted into plasma. By converting the $NH_3$ gas into plasma, the crystallinity of the tungsten nitride film formed by nitriding the tungsten film is increased.

After a predetermined time (for example, 0.01 to 5 seconds) has elapsed since opening the valve 55e, the valve 55e is closed and the valves 52e and 56e are opened to stop the supply of the $NH_3$ gas into the processing container 1 and to supply the purge gas stored in the storage tanks 52d and 56d into the processing container 1 (step S6). At this time, the purge gas is supplied from the storage tanks 52d and 56d having an increased pressure. Therefore, the purge gas is supplied into the processing container 1 at a relatively large flow rate, for example, a flow rate larger than the flow rate of the carrier gas. Thus, the $NH_3$ gas remaining in the processing container 1 is promptly discharged to the exhaust pipe 41, and the internal atmosphere of the processing container 1 is changed from the $NH_3$ gas atmosphere to the $N_2$ gas atmosphere in a short time. On the other hand, as the valve 55e is closed, the $NH_3$ gas supplied from the $NH_3$ gas supply source 55a to the gas supply line 55b is stored in the storage tank 55d, and the internal pressure of the storage tank 55d is increased.

The tungsten film is nitrided to form a tungsten nitride film by repeating a cycle of steps S5 to S6 (hereinafter referred to as "cycle β") by a second number of times (for example, 1 to 50 times).

Further, the cycle α repeated by the first number of times and the cycle β repeated by the second number of times are alternately repeated by a third number of times (for example, 1 to 200 times), whereby a tungsten nitride film having a desired thickness is formed. Thereafter, the wafer W is unloaded from the processing container 1 in a procedure that is the reverse to the procedure at the time of loading the wafer W into the processing container 1.

Incidentally, a tungsten nitride film may be formed by, after repeating the cycle α and the cycle β by the third number of times, repeating a cycle (hereinafter referred to as "cycle γ"), in which the $WCl_6$ gas and the $NH_3$ gas are alternately supplied, by a fourth number of times.

Effect

In the film forming method according to the embodiment of the present disclosure, the tungsten film is formed by repeating the cycle of alternately supplying the $WCl_6$ gas and the $H_2$ gas with the supply of the $N_2$ gas interposed therebetween. Thereafter, the $NH_3$ gas is supplied to nitride the tungsten film, thereby forming the tungsten nitride film. In other words, after the tungsten film with good step coverage is formed by the ALD method, the tungsten film is nitrided to form the tungsten nitride film. Therefore, the tungsten nitride film can be formed with a good filling property.

In the film forming method according to the embodiment of the present disclosure, the $WCl_6$ gas which is a fluorine-free raw material gas is used. Therefore, fluorine originating from the raw material gas is not introduced into the tungsten nitride film. This makes it possible to form a tungsten nitride film having a low fluorine concentration.

In the film forming method according to the embodiment of the present disclosure, the $N_2$ gas temporarily stored in the storage tanks 52d and 56d is supplied as a purge gas into the processing container 1, thereby discharging the $WCl_6$ gas, the $H_2$ gas and the $NH_3$ gas from the inside of the processing container 1. Therefore, the $WCl_6$ gas, the $H_2$ gas and the $NH_3$ gas remaining in the processing container 1 are promptly discharged to the exhaust pipe 41, and the internal atmosphere of the processing container 1 is changed from the atmosphere of the $WCl_6$ gas, the $H_2$ gas and the $NH_3$ gas to the $N_2$ gas atmosphere in a short time. As a result, it is possible to shorten the time required for forming the tungsten nitride film.

On the other hand, a method of forming a tungsten nitride film by alternately supplying a tungsten chloride gas and a nitrogen-containing gas with the supply of a purge gas interposed therebetween may be taken into account. However, in this case, particles are easily generated due to the strong reducing power of the $NH_3$ gas. It is possible to suppress generation of particles by completely discharging the $NH_3$ gas remaining in the processing container 1 to the exhaust pipe 41 through the use of a purge gas. However, in this case, there is a possibility that the time required for the purging may be prolonged.

In the case where bypass pipes are attached to the gas supply lines Mb, 54b and 55b, it is preferable that, before starting step S1, the valves installed in the bypass pipes are opened to discharge the $WCl_6$ gas, the $H_2$ gas and the $NH_3$ gas via the bypass pipes. This makes it possible to stabilize the initial flow rates of the $WCl_6$ gas, the $H_2$ gas and the $NH_3$ gas.

[Film Forming Apparatus of Modification 1]

Figure 3:
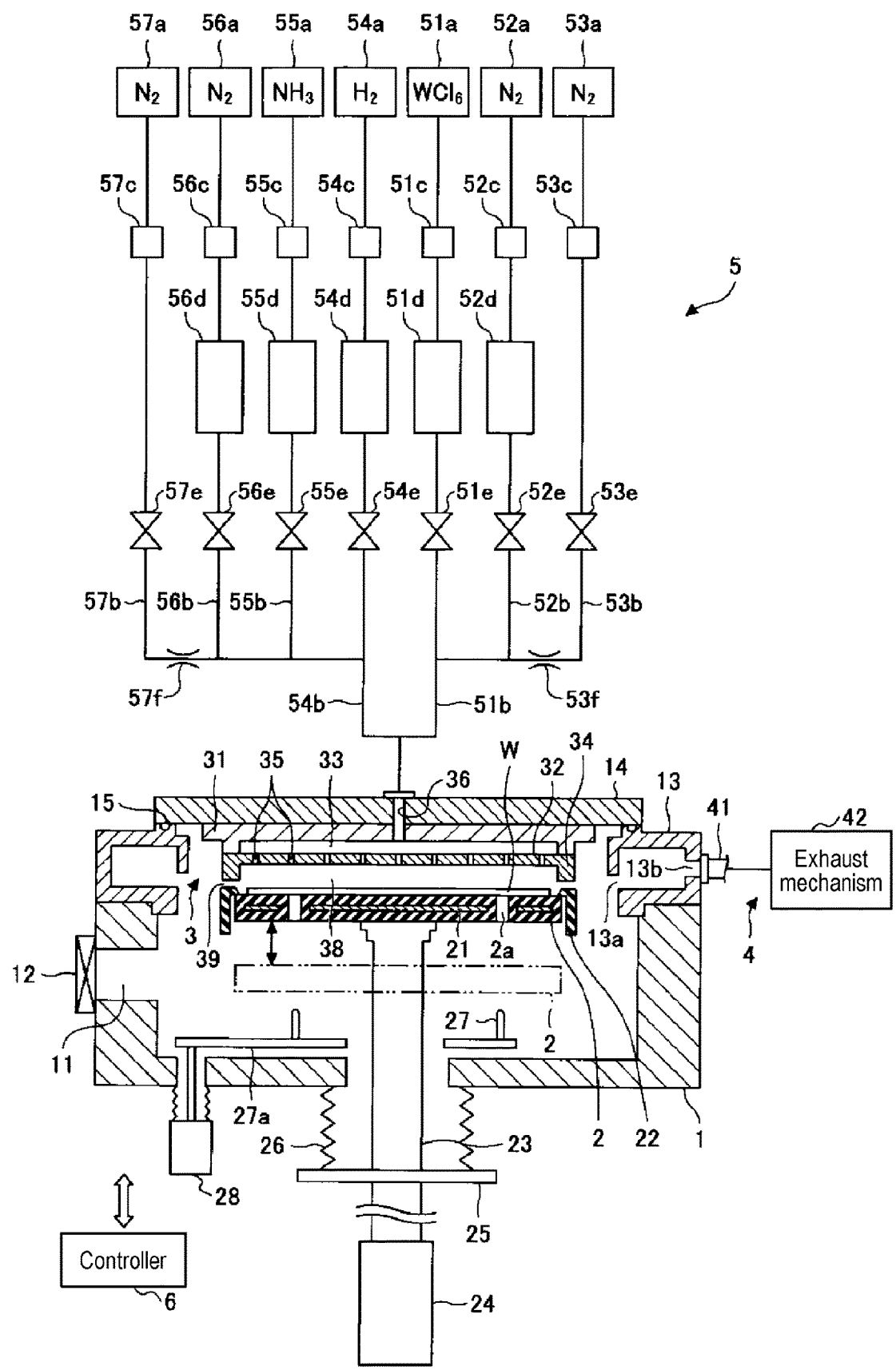
FIG. 3 is a schematic sectional view of a film forming apparatus according to modification 1 of the embodiment of the present disclosure.

A film forming apparatus according to modification 1 of the embodiment of the present disclosure will be described. FIG. 3 is a schematic sectional view of a film forming apparatus according to modification 1 of the embodiment of the present disclosure.

As shown in FIG. 3, in the film forming apparatus according to modification 1, the gas supply line 54b is connected to the gas supply line 51b and is brought into communication with the gas diffusion space 33 via the gas introduction hole 36. As a result, the gas supplied from the gas supply line 51b and the gas supplied from the gas supply line 54b are mixed before reaching the gas diffusion space 33.

Even in the case of using the film forming apparatus according to modification 1, as in the case of using the film forming apparatus shown in FIG. 1, a tungsten nitride film having a low fluorine concentration can be formed with a good filling property.

[Film Forming Apparatus of Modification 2]

Figure 4:
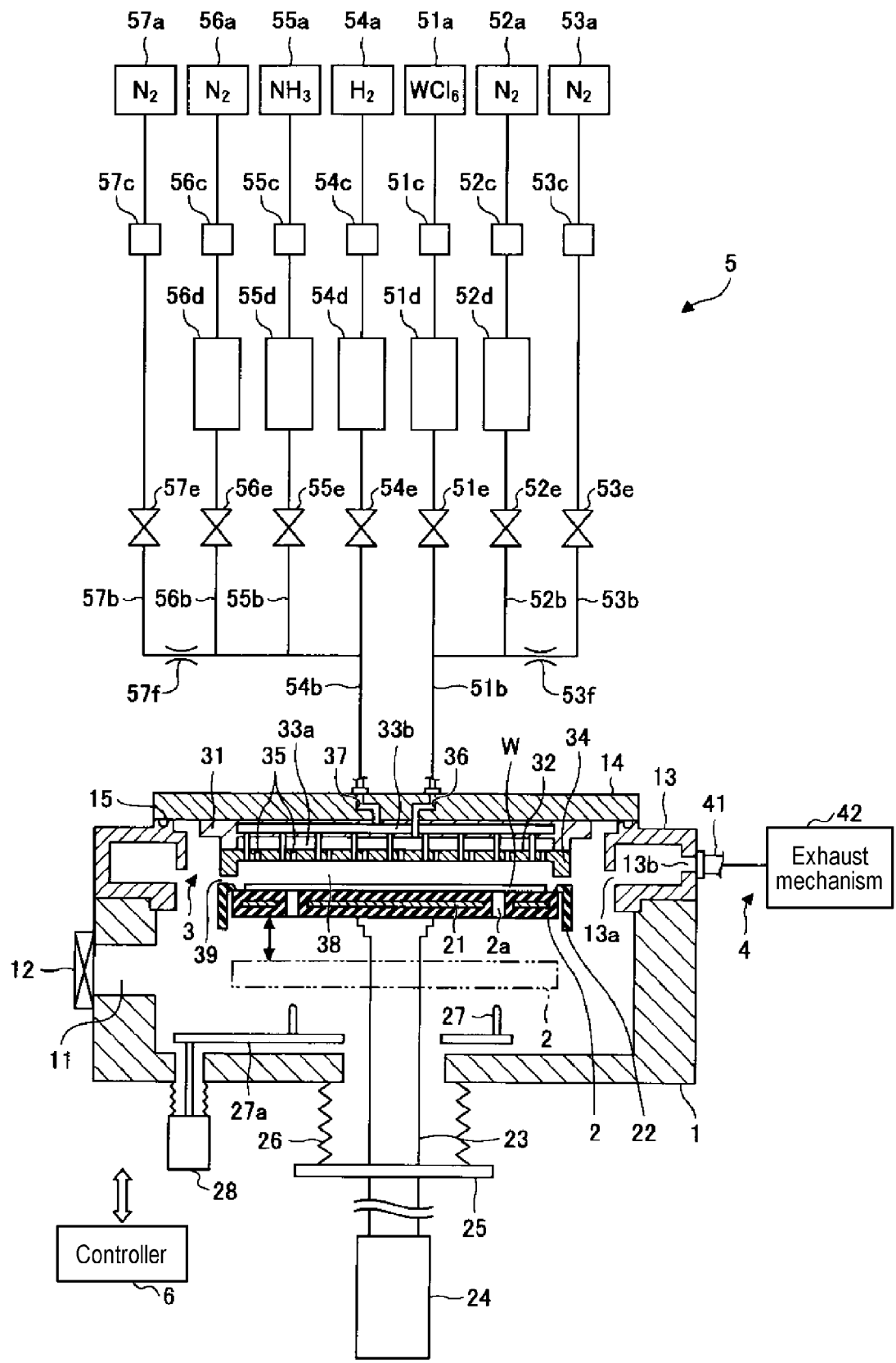
FIG. 4 is a schematic sectional view of a film forming apparatus according to modification 2 of the embodiment of the present disclosure.

A film forming apparatus according to modification 2 of the embodiment of the present disclosure will be described. FIG. 4 is a schematic sectional view of a film forming apparatus according to modification 2 of the embodiment of the present disclosure.

As shown in FIG. 4, in the film forming apparatus according to modification 2, the gas supply lines 51b and 54b communicate with different gas diffusion spaces 33a and 33b through the gas introduction holes 36 and 37, respectively. As a result, the gas supplied from the gas supply line 51b and the gas supplied from the gas supply line 54b are mixed in the processing space 38.

Even in the case of using the film forming apparatus according to modification 2, as in the case of using the film forming apparatus shown in FIG. 1, a tungsten nitride film having a low fluorine concentration can be formed with a good filling property.

Particularly, in modification 2, the $WCl_6$ gas and the $H_2$ gas and/or the $NH_3$ gas are not mixed in the gas diffusion spaces 33a and 33b. Therefore, the product attributable to the reaction of the $WCl_6$ gas and the $H_2$ gas and/or the $NH_3$ gas is not deposited in the gas diffusion spaces 33a and 33b. Accordingly, it is possible to prevent generation of particles due to the peeling of the product deposited in the gas diffusion spaces 33a and 33b.

EXAMPLES

Next, using the film forming apparatus of modification 1 shown in FIG. 3, a tungsten nitride film was formed on a wafer by the film forming method described above, and the film characteristics were evaluated.

Example 1

In Example 1, four types of samples (samples A, B, C and D) were prepared, and the crystallinity was evaluated by X-ray diffraction (XRD) analysis.

Sample A was obtained by forming a tungsten film on a wafer by performing the cycle α (steps S1 to S4) of the aforementioned film forming method while the wafer was heated to 500 degrees C.

Sample B was obtained by exposing sample A to an $NH_3$ gas for 900 seconds while sample A was heated to 500 degrees C.

Sample C was obtained by exposing sample A to an $NH_3$ gas for 900 seconds while sample A was heated to 550 degrees C.

Sample D was obtained by exposing sample A to a plasma-converted $NH_3$ gas for 30 seconds while sample A was heated to 420 degrees C.

The film formation conditions of sample A were as follows.

Figure 5:
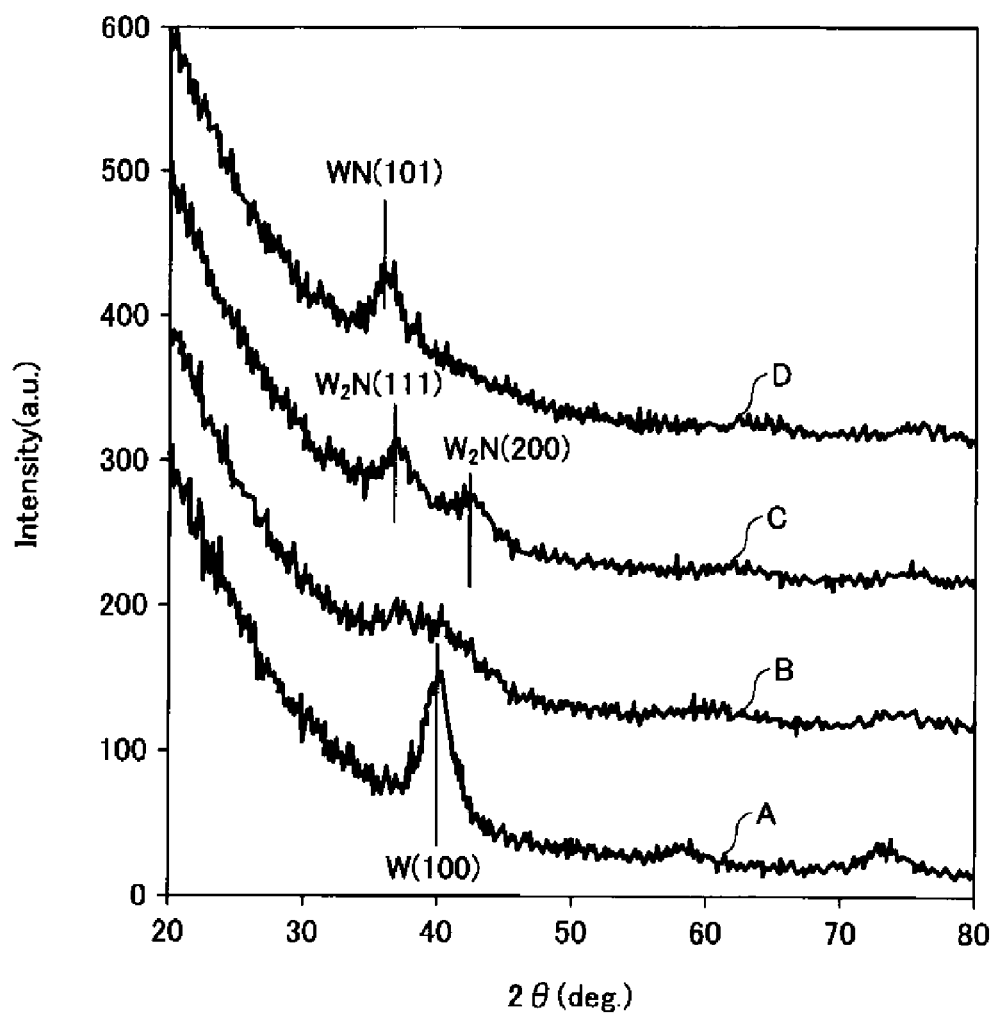
FIG. 5 is a view showing an X-ray diffraction spectrum obtained in an Example.

Film formation conditions
Time of step S1: 0.3 seconds
Time of step S2: 0.2 seconds
Time of step S3: 0.3 seconds
Time of step S4: 0.2 seconds
First number of times: 66 times FIG. 5 is a view showing the X-ray diffraction spectra obtained in the example. The spectra of samples A, B, C and D are shown sequentially from the lower side. In the graph of FIG. 5, the horizontal axis represents the diffraction angle (deg.) and the vertical axis represents the intensity (arbitrary unit).

As shown in FIG. 5, a peak indicating a W (100) plane was confirmed in the spectrum of sample A. In the spectrum of sample B, broad peaks showing a W (100) plane, a $W_2N$ (111) plane and a $W_2N$ (200) plane were confirmed. In the spectrum of sample C, peaks showing a $W_2N$ (111) plane and a $W_2N$ (200) plane were confirmed. In the spectrum of sample D, a peak showing a WN (101) plane was confirmed. Therefore, it can be seen from the respective spectra that tungsten nitride films are formed in samples B, C and D. It can also be noted that the crystal structure and crystallinity of the tungsten nitride film can be controlled depending on the temperature of the wafer or the presence or absence of plasma conversion of the $NH_3$ gas. Specifically, it can be seen that the increase in the temperature of the wafer leads to the increase in the crystallinity of the tungsten nitride film.

It can also be noted that the crystal structure of the tungsten nitride film is changed from $W_2N$ to WN by the plasma conversion of the $NH_3$ gas.

Example 2

In Example 2, one kind of sample (sample E) was prepared and the filling property of the tungsten nitride film was evaluated by a transmission electron microscope (TEM).

Sample E was obtained by a process in which the cycles α and β of the film forming method described above are performed to form a tungsten nitride film in the recess formed in a laminated film produced by alternately laminating a silicon nitride (SiN) film and a silicon oxide film ($SiO_2$) film on a wafer. The film formation conditions in the cycles α and β were as follows.

Figure 6:
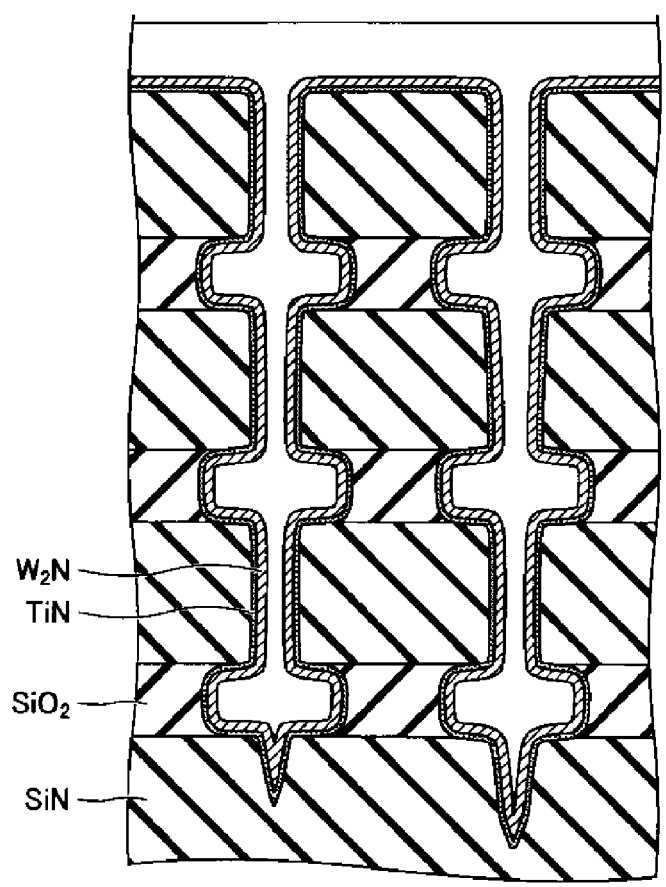
FIG. 6 is a view showing a TEM image obtained in an Example.

Film formation conditions
Time of step S1: 0.3 seconds
Time of step S2: 0.2 seconds
Time of step S3: 0.3 seconds
Time of step S4: 0.2 seconds
Time of step S5: 30 seconds
Time of step S6: 30 seconds
First number of times: 10 times
Second number of times: once
Third number of times: 7 times FIG. 6 is a view showing a TEM image obtained in the Example 2. FIG. 6 shows a cross section when a 1 nm thick titanium nitride (TiN) film was formed and then a tungsten nitride film was formed in the recess formed in a laminated film produced by alternately laminating a silicon nitride (SiN) film and a silicon oxide film ($SiO_2$) film on a wafer.

As shown in FIG. 6, it was confirmed that the tungsten nitride film was formed in the recess with a good filling property. Therefore, it can be seen from the cross-sectional TEM image that in sample E, the tungsten nitride film can be formed in the recess with a good filling property.

Example 3

In Example 3, six kinds of samples (samples F, G, H, I, J and K) were prepared, and film characteristics were evaluated.

Sample F was obtained by forming a film on a $SiO_2$ film having a flat surface by executing the cycle α while setting the first number of times to 46 times in the film forming method described above. The thickness of the film thus formed was 2.97 nm.

Sample G was obtained by forming a film on a $SiO_2$ film having a flat surface by executing the cycles α and β while setting the first number of times to 46 times, the second number of times to once and the third number of times to once in the film forming method described above. The thickness of the film thus formed was 3.07 nm.

Sample H was obtained by forming a film on a $SiO_2$ film having a flat surface by executing the cycles α and β while setting the first number of times to 30 times, the second number of times to once and the third number of times to twice in the film forming method described above. The thickness of the film thus formed was 2.69 nm.

Sample I was obtained by forming a film on a $SiO_2$ film having a flat surface by executing the cycles α and β while setting the first number of times to 25 times, the second number of times to once and the third number of times to 3 times in the film forming method described above. The thickness of the film thus formed was 2.96 nm.

Sample J was obtained by forming a film on a $SiO_2$ film having a flat surface by executing the cycles α and β while setting the first number of times to 15 times, the second number of times to once and the third number of times to 5 times in the film forming method described above. The thickness of the film thus formed was 2.71 nm.

Sample K was obtained by forming a film on a $SiO_2$ film having a flat surface by executing the cycle γ without executing the cycles α and β while setting the fourth number of times to 70 times in the film forming method described above. The thickness of the film thus formed was 2.25 nm.

FIG. 7 is a diagram showing the film characteristics obtained in the example. FIG. 7 shows the process conditions, the recipe time (second), the wafer temperature (degrees C.), the film thickness (nm), the crystal structure and the number of particles (particle diameter >0.06 μm) for each sample.

As shown in FIG. 7, in samples H, I, J and K, it was confirmed that a tungsten nitride film having a crystal structure of $W_2N$ was formed. On the other hand, in samples F and G, it was confirmed that a tungsten film was formed. Therefore, in the case of forming a tungsten nitride film by the above-described film forming method while setting the temperature of the wafer to 500 degrees C., it can be noted that the tungsten nitride film can be formed by setting the first number of times to 30 times or less.

As shown in FIG. 7, it was confirmed that the numbers of particles adhering to the film in samples F, G, H, I, J, and K were 4, 16, 2, 2437, 23939 and a value equal to or larger than a measurement upper limit, respectively. Therefore, in the case where the tungsten nitride film is formed by the aforementioned film forming method while setting the wafer temperature to 500 degrees C., the first number of times is preferably 30 times or more, more preferably 46 times or more.

While the modes for carrying out the present disclosure have been described above, the above contents do not limit the contents of the present disclosure. Various modifications and improvements may be made within the scope of the present disclosure.

In the above-described embodiment, the case where the tungsten nitride film is formed using the $WCl_6$ gas as a tungsten chloride gas has been described by way of example. However, the present disclosure is not limited thereto. Other tungsten chloride gases such as, for example, a $WCl_5$ gas and the like may be used. Even when the $WCl_5$ gas is used, it shows almost the same behavior as the $WCl_6$ gas.

In the above-described embodiment, the case where the $H_2$ gas is used as a hydrogen-containing gas has been described by way of example. However, the present disclosure is not limited thereto. Other gases may be used as long as they reduce the $WCl_6$ gas.

In the above-described embodiment, the case where the $N_2$ gas is used as a purge gas and as a carrier gas has been described by way of example. However, the present disclosure is not limited thereto. Other inert gases such as an Ar gas and the like may be used.

Furthermore, in the above-described embodiment, the semiconductor wafer has been described as an example of the substrate to be processed. However, the semiconductor wafer may be a silicon wafer or may be a semiconductor wafer of a compound such as GaAs, SiC, GaN or the like. In addition, the substrate to be processed is not limited to the semiconductor wafer, but may be a glass substrate used for an FPD (flat panel display) such as a liquid crystal display device or the like, a ceramic substrate, or the like.

According to the film forming method disclosed herein, it is possible to form a tungsten nitride film having a low fluorine concentration and a good filling property.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a tungsten nitride film on a substrate to be processed, comprising:

forming a tungsten film by repeating, a first number of times, a first cycle of alternately supplying a tungsten chloride gas and a hydrogen-containing gas with a supply of a purge gas interposed between the supply of the tungsten chloride gas and the supply of the hydrogen-containing gas; and forming a tungsten nitride film by repeating, a second number of times, a second cycle of alternately supplying an ammonia gas and the purge gas to nitride the tungsten film formed in the step of forming the tungsten film.

2. The method of claim 1, wherein the step of forming the tungsten film and the step of forming the tungsten nitride film are alternately repeated a third number of times.

3. The method of claim 1, further comprising:

forming an additional tungsten nitride film by repeating, a fourth number of times, an additional cycle of alternately supplying the tungsten chloride gas and the ammonia gas.

4. The method of claim 1, wherein the tungsten chloride gas is a $WCl_5$ gas or a $WCl_6$ gas.

5. The method of claim 1, wherein the hydrogen-containing gas is an $H_2$ gas.

6. The method of claim 1, wherein a plurality of recesses having different sizes are formed in the substrate to be processed.

* * * * *